(12) United States Patent
Miyazawa et al.

(10) Patent No.: US 8,963,506 B2
(45) Date of Patent: Feb. 24, 2015

(54) BATTERY MANAGEMENT SYSTEM AND METHOD OF ESTIMATING BATTERY STATE OF CHARGE

(75) Inventors: Hiroshi Miyazawa, Yongin-si (KR); Yusai Murakami, Yongin-si (KP)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 729 days.

(21) Appl. No.: 13/137,959

(22) Filed: Sep. 22, 2011

(65) Prior Publication Data

US 2012/0091946 A1  Apr. 19, 2012

(30) Foreign Application Priority Data

Oct. 13, 2010  (KR) .................. 10-2010-0099927

(51) Int. Cl.
*H02J 7/04* (2006.01)
*H02J 7/16* (2006.01)
*G01R 31/36* (2006.01)

(52) U.S. Cl.
CPC .................. *G01R 31/361* (2013.01)
USPC ............ 320/149; 320/132; 320/152; 320/157

(58) Field of Classification Search
CPC ...................................... H02J 7/0078
USPC ......................................... 320/149
See application file for complete search history.

(56) References Cited

U.S. PATENT DOCUMENTS

| 6,845,332 | B2* | 1/2005 | Teruo ................. 702/63 |
| 7,362,076 | B2 | 4/2008 | Namba et al. |
| 7,679,327 | B2 | 3/2010 | Kim et al. |
| 7,728,555 | B2* | 6/2010 | Seo et al. ............ 320/132 |
| 2003/0097225 | A1 | 5/2003 | Teruo |
| 2005/0017725 | A1* | 1/2005 | Murakami et al. ........ 324/426 |
| 2006/0261782 | A1 | 11/2006 | Kim et al. |

FOREIGN PATENT DOCUMENTS

| CN | 1988314 A | 6/2007 |
| CN | 101176234 A | 5/2008 |
| JP | 2003-149307 A | 5/2003 |
| JP | 2003-197272 A | 7/2003 |
| JP | 2006-017544 A | 1/2006 |
| JP | 2006-058114 A | 3/2006 |

(Continued)

OTHER PUBLICATIONS

Korean Office Action in KR 10-2010-0099927, dated Feb. 20, 2012 (Miyazawa, et al.).

(Continued)

*Primary Examiner* — Edward Tso
*Assistant Examiner* — Ahmed Omar
(74) *Attorney, Agent, or Firm* — Lee & Morse, P.C.

(57) ABSTRACT

A battery management system and method accurately estimate a state of charge (SOC) of a battery. For this, the battery management system may include a unit SOC calculator calculating a unit SOC by using a charge/discharge current of a battery, an electromotive force SOC calculator calculating an electromotive force SOC using an electromotive force of the battery; a corrector calculating a compensation amount using the electromotive force SOC and a previous SOC, and an SOC calculator calculating a current SOC using the unit SOC, the previous SOC, and the compensation amount.

16 Claims, 3 Drawing Sheets

(56) References Cited

FOREIGN PATENT DOCUMENTS

| | | |
|---|---|---|
| JP | 2006-098134 A | 4/2006 |
| JP | 2006-275797 A | 10/2006 |
| JP | 10-0669475 B1 | 1/2007 |
| JP | 2007-292666 A | 11/2007 |
| JP | 2007-2924778 A | 11/2007 |
| JP | 2008-541012 A | 11/2008 |
| JP | 2009-264962 A | 11/2009 |
| KR | 10 2004-0060998 A | 7/2004 |
| WO | WO 2009/088272 A2 | 7/2009 |

OTHER PUBLICATIONS

Korean Notice of Allowance in KR 10-2010-0099927, dated Sep. 21, 2012 (Miyazawa, et al.).

Japanese Office action dated Oct. 2, 2012 for JP 2011-014988. (Miyazawa, et al.).

Chinese Office Action dated Feb. 8, 2014.

Chinese Office Action dated Sep. 11, 2014.

* cited by examiner

BATTERY MANAGEMENT SYSTEM AND METHOD OF ESTIMATING BATTERY STATE OF CHARGE

BACKGROUND

1. Field

Embodiments relate to a battery management system managing a battery by estimating a state of charge (SOC) of a rechargeable/dischargeable rechargeable battery, and a method for estimating a battery SOC.

2. Description of the Related Art

A vehicle that uses an internal combustion engine, which uses gasoline or diesel oil as a main fuel, has caused serious environmental pollution, such as air pollution. Consequently, in order to reduce the amount of environmental pollution, efforts have been made to develop electric vehicles or hybrid vehicles.

The electric vehicle uses an electric engine that is powered by electrical energy output from a battery. The electric vehicle uses a battery having a plurality of rechargeable battery cells formed into one pack as a main power source. Therefore, the electric vehicle does not exhaust gas or produce loud noises.

A hybrid vehicle is a cross between a vehicle using an internal combustion engine and an electric vehicle. The hybrid vehicle uses two or more kinds of power sources, e.g., an internal combustion engine and an electric engine. Currently, a complex hybrid car, such as a hybrid car that uses the internal combustion engine and fuel cells, which directly obtain electrical energy by causing a chemical reaction while continuously supplying hydrogen and oxygen, or a hybrid car that uses the battery and the fuel cells, has been developed.

The performance of the vehicle using the electrical energy is directly affected by the performance of the battery. Therefore, each battery cell needs to have high performance. Furthermore, a battery management system has been required to efficiently manage the charging and discharging of the battery cells. The conventional battery management system estimates the SOC by ampere counting or by relying on previously determined relationship between the SOC and elements, e.g., an open circuit voltage (OCV), a discharge voltage, an internal resistance, a temperature, or a discharge current.

The above information disclosed in this Background section is only for enhancement of understanding of the background of the invention and therefore it may contain information that does not form the prior art that is already known in this country to a person of ordinary skill in the art.

SUMMARY

At least one embodiment may provide a battery management system and method capable of improving accuracy of SOC estimation.

A battery management system according to embodiments includes an unit SOC calculator calculating an unit SOC by using a charge/discharge current of a battery; an electromotive force SOC calculator calculating an electromotive force SOC by using electromotive force of the battery; a corrector calculating a compensation amount by using the electromotive force SOC and a previous SOC; and an SOC calculator calculating a current SOC by adding the unit SOC, the previous SOC, and the compensation amount.

The SOC calculator may calculate the current SOC by $$SOCn+1 = SOCn + SOCi + Kp(SOCv - SOCn) + Ki\int(SOCv - SOCn)dt$$

(here, SOCn+1 is the current SOC, SOCn is the previous SOC, SOCi is the unit SOC, SOCv is the electromotive force SOC, and Kp and Ki are constants). A sensing unit sensing the charge/discharge current and battery terminal voltage from the battery and measuring an internal resistance of the battery by using the charge/discharge current and the battery terminal voltage may be further included. The electromotive force SOC calculator may determine a polarization voltage using the charge/discharge current and the internal resistance, and may calculate the electromotive force by subtracting the polarization voltage from the battery terminal voltage.

A battery management system according to embodiments includes an unit SOC calculator calculating a unit SOC using a charge/discharge current of a battery; an electromotive force SOC calculator calculating an electromotive force SOC by using an electromotive force of the battery; an integration SOC calculator calculating an integration SOC by add the unit SOC and the previous SOC; a corrector calculating a compensation amount using the integration SOC, the electromotive force SOC, and the previous SOC; and an SOC calculator calculating a current SOC by adding the integration SOC and the compensation amount.

The SOC calculator may calculate the current SOC by $$SOCn+1 = SOCI + SOCi + Kp(SOCv - SOCI) + Ki\int(SOCv - SOCI)dt$$

(here, SOCn+1 is the current SOC, SOCI is the integration SOC, SOCv is the electromotive force SOC, and Kp and Ki are constants). The unit SOC calculator may integrate the charge/discharge current during a unit time to calculate a unit time charge/discharge charge amount, and divides the unit time charge/discharge charge amount by the total charge/discharge charge amount of the battery to calculate the unit SOC.

A correction unit correcting the compensation amount according to the unit time charge/discharge charge amount may be further included, and the SOC calculator may calculate the current SOC by adding the corrected compensation amount and the integration SOC. The correction unit may correct the compensation amount for the current SOC to be included in a predetermined SOC range with reference to the previous SOC when the unit time charge/discharge charge amount is smaller than a predetermined threshold unit charge/discharge charge amount. The correction unit may correct the compensation amount for the current SOC to be increased or decreased corresponding to the charge/discharge of the battery.

A sensing unit sensing the charge/discharge current and battery terminal voltage from the battery and measuring an internal resistance of the battery by using the charge/discharge current and the battery terminal voltage may be further included.

The electromotive force SOC calculator may determine a polarization voltage using the charge/discharge current and the internal resistance, and calculates the electromotive force by subtracting the polarization voltage from the battery terminal voltage.

A method for estimating a battery SOC using a battery management system according to embodiments includes calculating a unit SOC using a charge/discharge current of a battery, calculating an electromotive force SOC using an electromotive force of the battery, calculating a compensation amount using the electromotive force SOC and the previous SOC, and calculating a current SOC by adding the unit SOC, the previous SOC, and the compensation amount.

Calculation of the current SOC may be executed by $$SOCn+1 = SOCn + SOCi + Kp(SOCv-SOCn) + Ki\!\int(SOCv-SOCn)dt$$

(here, SOCn+1 is the current SOC, SOCn is the previous SOC, SOCi is the unit SOC, SOCv is the electromotive force SOC, and Kp and Ki are constants).

A method for estimating a battery SOC using a battery management system according to embodiments includes calculating a unit SOC using a charge/discharge current of a battery, calculating an electromotive force SOC by using an electromotive force of the battery, calculating an integration SOC by adding the unit SOC and the previous SOC, calculating a compensation amount by using the integration SOC, the electromotive force SOC, and the previous SOC, and calculating a current SOC by adding the integration SOC and the compensation amount.

The calculation of the current SOC may be executed by $$SOCn+1 = SOCI + SOCi + Kp(SOCv-SOCI) + Ki\!\int(SOCv-SOCI)dt$$

(here, SOCn+1 is the current SOC, SOCI is the integration SOC, SOCv is the electromotive force SOC, and Kp and Ki are constants).

Calculation of the unit SOC may include integrating the charge/discharge current during a unit time to calculate a unit time charge/discharge charge amount; and dividing the unit time charge/discharge charge amount by the total charge/discharge charge amount of the battery.

The method may further include correcting the compensation amount according to the unit time charge/discharge charge amount. Correction of the compensation amount may be executed for the current SOC to be included in a predetermined SOC range with reference to the previous SOC when the unit time charge/discharge charge amount is smaller than a predetermined threshold unit charge/discharge charge amount. Correction of the compensation amount may be executed for the current SOC to be increased or decreased corresponding to the charge/discharge of the battery.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
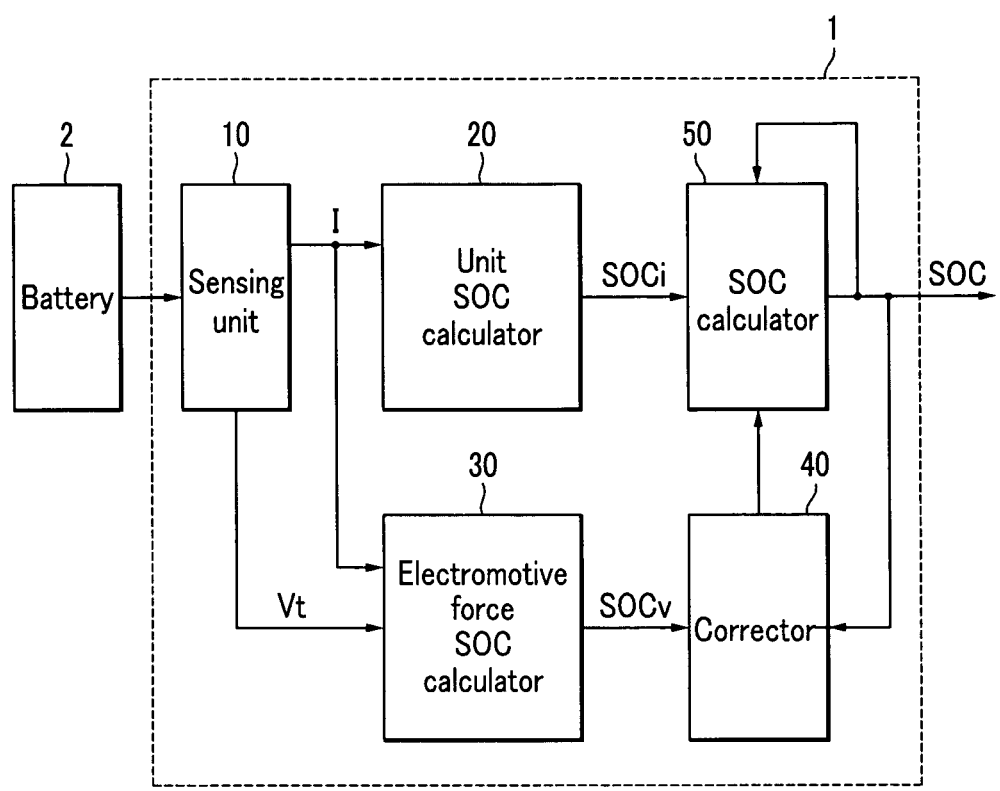
FIG. 1 illustrates a block diagram of a battery management system connected to a battery 2 according to the first exemplary embodiment.

Korean Patent Application No. 10-2010-0099927, filed on Oct. 13, 2010, in the Korean Intellectual Property Office, and entitled: "Battery Management System and Method of Estimating Battery State of Charge Using the Same," is incorporated by reference herein in its entirety.

In the following detailed description, only certain exemplary embodiments will be shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 is a block diagram of a battery management system connected to a battery 2 according to the first exemplary embodiment. Referring to FIG. 1, a battery management system 1 includes a sensing unit 10, a unit SOC calculator 20, an electromotive force SOC calculator 30, a corrector 40, and an SOC calculator 50. As will be described below, the battery management system 1 according to an exemplary embodiment newly calculates the SOC per unit time. The SOC that is calculated before the SOC that is currently being calculated is referred to as a previous SOC, while the SOC that is currently being calculated is referred to as a current SOC.

The battery 2 may include a plurality of battery cells (not shown) connected in series. A charge/discharge current I is a current flowing in the plurality of battery cells connected in series. A battery terminal voltage Vt is a voltage difference between both terminals of the plurality of battery cells.

The sensing unit 10 of the battery management system 1 according to the first exemplary embodiment is connected to the battery 2, thereby measuring the charge/discharge current I flowing in the battery 2 and the battery terminal voltage Vt. The sensing unit 10 may measure an internal resistance of the battery 2 using the charge/discharge current I and the battery terminal voltage Vt. The sensing unit 10 may provide the measured charge/discharge current I, the battery terminal voltage Vt, and the internal resistance to the unit SOC calculator 20 and the electromotive force SOC calculator 30.

The unit SOC calculator 20 integrates the charge/discharge current I per unit time over the unit time to calculate a unit time charge/discharge charge amount Qi. Also, the unit SOC calculator 20 divides the unit time charge/discharge charge amount Qi by the total charge/discharge charge amount Qf of the battery 2 to calculate the change of the SOC per unit time. The change amount of the SOC per the unit time is referred to as a unit SOC SOCi. The unit SOC calculator 20 provides the unit SOC SOCi to the SOC calculator 50.

The electromotive force SOC calculator 30 calculates a polarization voltage using the internal resistance of the battery 2 and the charge/discharge current I, and subtracts the polarization voltage from the voltage Vt of the battery 2 to calculate the electromotive force of the battery 2. Also, the electromotive force SOC calculator 30 calculates the electromotive force SOC SOCv from the electromotive force of the battery 2.

The corrector 40 calculates a compensation amount according to PI (proportional integral) control using the electromotive force SOC SOCv and the previous SOC. The SOC calculator 50 calculates the current SOC by adding the unit SOC SOCi, the previous SOC, and the compensation amount calculated from the corrector 40. Here, the current SOC is calculated by Equation 1 below.

$$SOCn+1 = SOCn + SOCi + Kp(SOCv-SOCn) + Ki\!\int(SOCv-SOCn)dt \qquad \text{(Equation 1)}$$

(here, SOCn+1 is the current SOC, SOCn is the previous SOC, and Kp and Ki are constants)

In Equation 1, the compensation amount is determined by multiplying a value of the previous SOC SOCn subtracted from the electromotive force SOC SOCv by the constant Kp and multiplying an integration factor calculated by integrating a value of the previous SOC SOCn subtracted from the electromotive force SOC SOCv for the unit time by the constant Ki. Here, Kp and Ki, which are feedback gain constants, may be calculated experimentally.

In the first exemplary embodiment, the compensation amount is determined using the electromotive force SOC SOCv. Accordingly, the compensation amount depends on the electromotive force of the battery 2 such that the electromotive force affects the current SOC SOCn+1. For example, when the electromotive force SOC SOCv is higher than the previous SOC SOCn, and the SOC (SOCn+SOCi) by the current integration (hereinafter, referred to as an integration SOC SOCI) is higher than the electromotive force SOC SOCv, Equation 1 estimates that the current SOC SOCn+1 is higher than the integration SOC SOCI.

Figure 2:
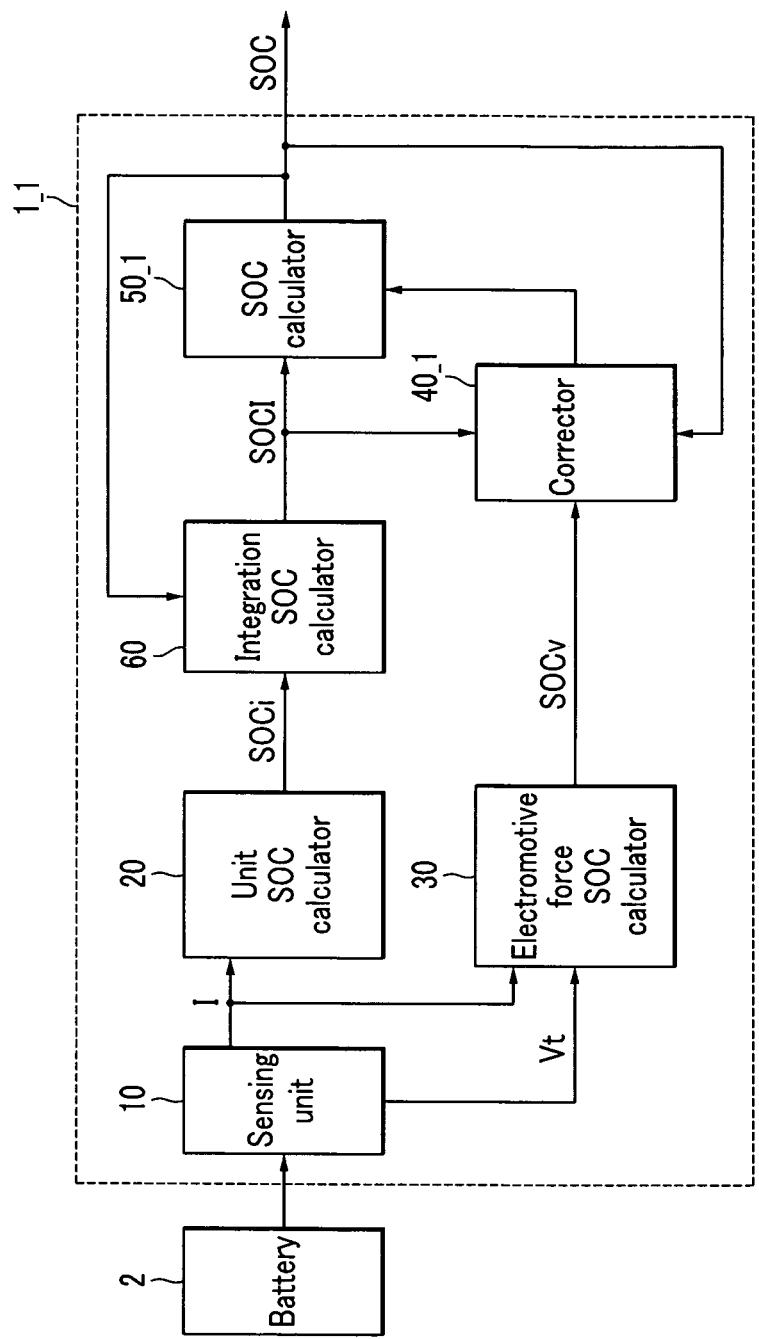
FIG. 2 illustrates a block diagram of a battery management system connected to a battery 2 according to the second exemplary embodiment.

When the current SOC SOCn+1 is to have a value between the integration SOC SOCI and the electromotive force SOC SOCv, a battery management system according to the second exemplary embodiment may be used. FIG. 2 is a block diagram of a battery management system connected to a battery 2 according to the second exemplary embodiment.

Referring to FIG. 2, a battery management system 1_1 includes the sensing unit 10, the unit SOC calculator 20, the electromotive force SOC calculator 30, a corrector 40_1, an integration SOC calculator 60, and an SOC calculator 50_1. The operation of the sensing unit 10, the unit SOC calculator 20, and the electromotive force SOC calculator 30 is the same as that of FIG. 1 such that the description thereof is not repeated.

The corrector 40_1 calculates the compensation amount according to the PI control by using the integration SOC SOCI, the electromotive force SOC SOCv, and the previous SOC. The integration SOC calculator 60 calculates the integration SOC SOCI by adding the unit SOC SOCi and the previous SOC. The SOC calculator 50_1 calculates the current SOC by adding the integration SOC SOCI and the compensation amount calculated from the corrector 40_1. Here, the current SOC may be calculated by Equation 2.

$$SOCn+1 = SOCI + SOCi + Kp(SOCv - SOCI) + Ki\int(SOCv - SOCI)dt \quad \text{(Equation 2)}$$

(here, SOCn+1 is the current SOC, SOCn is the previous SOC, and Kp and Ki are constants)

In Equation 2, the compensation amount is determined by a multiplying a value of the integration SOC SOCI subtracted from the electromotive force SOC SOCv by the constant Kp and multiplying an integration factor calculated by integrating a value of the integration SOC SOCI subtracted from the electromotive force SOC SOCv for the unit time by the constant Ki.

The electromotive force SOC SOCv is larger than the previous SOC SOCn, but is not larger than the integration SOC SOCI. Accordingly, the current SOC SOCn+1 is less than the integration SOC SOCI. Thus, the current SOC SOCn+1 is determined to have a value between the electromotive force SOC SOCv and the integration SOC SOLI.

Figure 3:
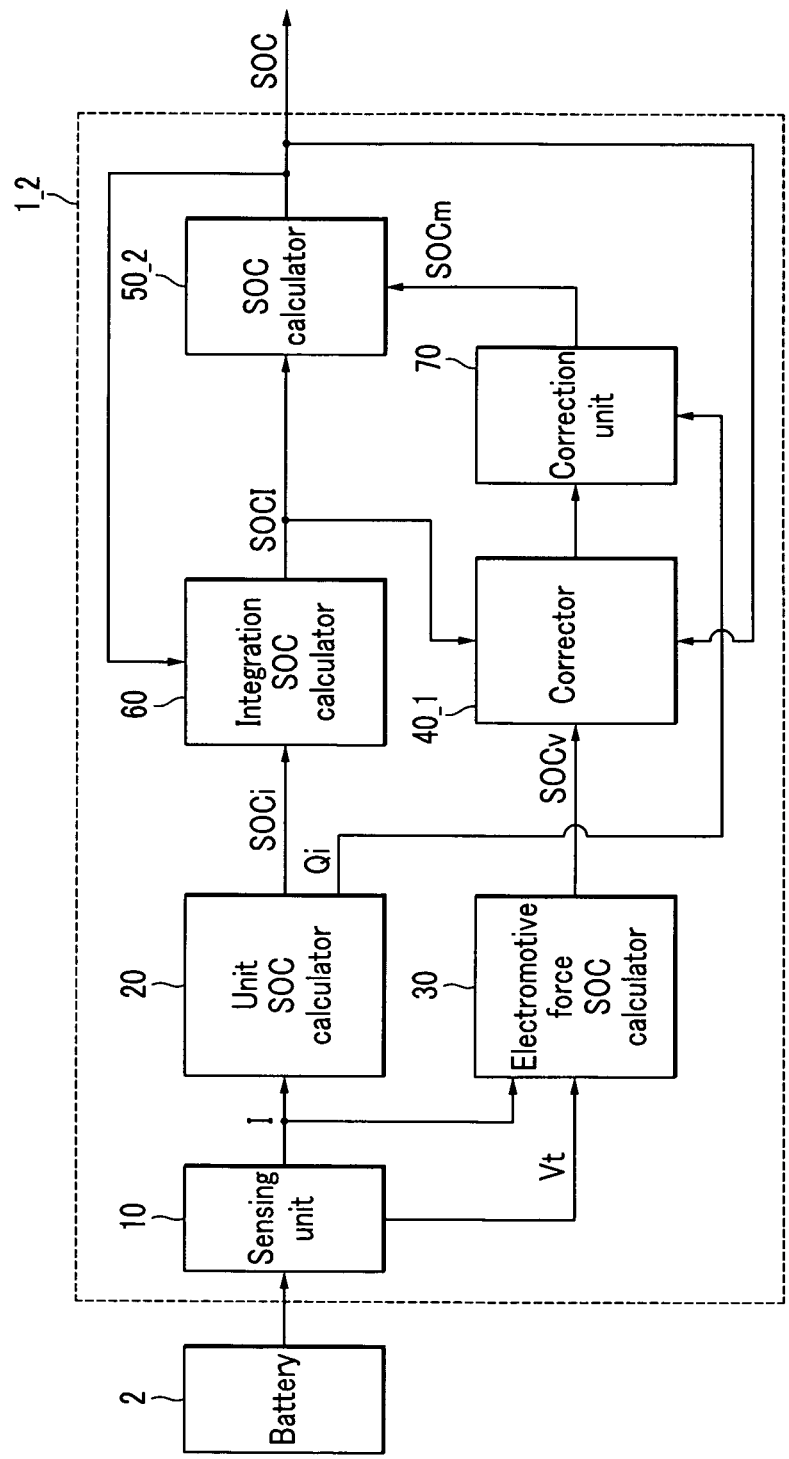
FIG. 3 illustrates a block diagram of a battery management system connected to a battery 2 according to the third exemplary embodiment.

FIG. 3 is a block diagram of a battery management system connected to a battery 2 according to the third exemplary embodiment of the present invention.

Referring to FIG. 3, a battery management system 1_2 according to the third exemplary embodiment includes the sensing unit 10, the unit SOC calculator 20, the electromotive force SOC calculator 30, the corrector 40_1, the integration SOC calculator 60, an SOC calculator 50_2, and a correction unit 70. The operation of the sensing unit 10, the unit SOC calculator 20, the electromotive force SOC calculator 30, the corrector 40_1, and the integration SOC calculator 60 is the same as that of FIG. 2, and the description thereof will not be repeated.

The SOC calculator 50_2 calculates the current SOC by adding the unit SOC SOCi, the previous SOC, and a correction SOC SOCm calculated in the correction unit 70. The correction unit 70 corrects the compensation amount calculated in the corrector 40_1 according to the unit SOC SOCi to calculate the correction SOC SOCm. The correction unit 70 corrects the compensation amount for the current SOC to be satisfied with a condition 1 and a condition 2.

In condition 1, when the unit time charge/discharge charge amount Qi is small, the current SOC is included in a predetermined SOC correction range with reference to the previous SOC. Here, the reference (hereinafter, referred to as a threshold unit charge/discharge charge amount) for determining whether the charge amount is small and the predetermined SOC correction range is set in the correction unit 70. The correction unit 70 receives the unit time charge/discharge charge amount Qi to control the compensation amount to be included in the predetermined first threshold correction range if the unit time charge/discharge charge amount Qi is smaller than the threshold unit charge/discharge charge amount. The first threshold correction range is determined according to the unit time charge/discharge charge amount Qi. That is, the first threshold correction range increases as the unit time charge/discharge charge amount Qi increases.

In condition 2, the current SOC is decreased or increased corresponding to the charge/discharge of the battery 2. That is, when the battery 2 is charged, the current SOC is increased compared to the previous SOC and, when the battery 2 is discharged, the current SOC is decreased compared to the previous SOC. For this, the correction unit 70 is controlled for the compensation amount to be included in the second threshold correction range. Here, the second threshold correction range means a range for the current SOC to not be less than the previous SOC by the compensation amount when the battery is charged, or for the current SOC to not be more than the previous SOC by the compensation amount when the battery is discharged. The second threshold correction range may be determined according to the unit SOC SOCi. For example, the second threshold correction range may have an upper limit and a lower limit respectively having a positive and a negative for a value in which a predetermined proportion constant is multiplied by the unit SOC. Here, the proportion constant may be determined experimentally.

By way of summation and review, in the conventional SOC estimation methods, problems may arise. For example, the ampere counting can result in errors. When using a predetermined relationship between one or more elements and the SOC, this predetermined relationship should be calculated for each battery using a complex experimental method, since characteristics of each battery differ. Accordingly, conventional estimation methods create an error or need a complex experimental method for each battery.

In contrast, in accordance with embodiments, the SOC of a battery may be estimated using a unit SOC based on a charge/discharge current of the battery, a previous SOC, and a compensation amount based on an electromotive force of the battery and the previous SOC.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A battery management system, comprising:
   a unit SOC calculator calculating a unit SOC using a charge/discharge current of a battery;
   an electromotive force SOC calculator calculating an electromotive force SOC using an electromotive force of the battery;
   a corrector calculating a compensation amount using the electromotive force SOC and a previous SOC; and
   an SOC calculator calculating a current SOC by adding the unit SOC, the previous SOC, and the compensation amount, wherein the SOC calculator calculates the current SOC by:

$$SOCn+1=SOCn+SOCi+Kp(SOCv-SOCn)+Ki\int(SOCv-SOCn)dt$$

where, SOCn+1 is the current SOC, SOCn is the previous SOC, SOCi is the unit SOC, SOCv is the electromotive force SOC, and Kp and Ki are constants).

2. The battery management system as claimed in claim 1, further comprising: a sensor to sense the charge/discharge current and battery terminal voltage from the battery and measuring an internal resistance of the battery by using the charge/discharge current and the battery terminal voltage.

3. The battery management system as claimed in claim 2, wherein:
   the electromotive force SOC calculator determines a polarization voltage using the charge/discharge current and the internal resistance, and calculates the electromotive force by subtracting the polarization voltage from the battery terminal voltage.

4. A battery management system, comprising:
   a unit SOC calculator calculating a unit SOC by using a charge/discharge current of a battery;
   an electromotive force SOC calculator calculating an electromotive force SOC using an electromotive force of the battery;
   an integration SOC calculator calculating an integration SOC by adding the unit SOC and a previous SOC;
   a corrector calculating a compensation amount by using the integration SOC, the electromotive force SOC, and the previous SOC; and
   an SOC calculator calculating a current SOC by adding the integration SOC and the compensation amount, wherein the SOC calculator calculates the current SOC by:

$$SOCn+1=SOCI+SOCi+Kp(SOCv-SOCI)+Ki\int(SOCv-SOCI)dt$$

where SOCn+1 is the current SOC, SOCI is the integration SOC, SOCv is the electromotive force SOC, and Kp and Ki are constants.

5. The battery management system as claimed in claim 4, wherein: the unit SOC calculator integrates the charge/discharge current during a unit time to calculate a unit time charge/discharge charge amount, and divides the unit time charge/discharge charge amount by the total charge/discharge charge amount of the battery to calculate the unit SOC.

6. The battery management system as claimed in claim 5, further comprising:
   a corrector to correct the compensation amount according to the unit time charge/discharge charge amount; and
   the SOC calculator calculates the current SOC by adding the corrected compensation amount and the integration SOC.

7. The battery management system as claimed in claim 6, wherein: the corrector corrects the compensation amount for the current SOC to be included in a predetermined SOC range with reference to the previous SOC when the unit time charge/discharge charge amount is smaller than a predetermined threshold unit charge/discharge charge amount.

8. The battery management system as claimed in claim 6, wherein: the corrector corrects the compensation amount for the current SOC to be increased or decreased corresponding to the charge/discharge of the battery.

9. The battery management system as claimed in claim 4, further comprising: a sensor to sense the charge/discharge current and battery terminal voltage from the battery and measuring an internal resistance of the battery by using the charge/discharge current and the battery terminal voltage.

10. The battery management system as claimed in claim 4, wherein:
    the electromotive force SOC calculator determines a polarization voltage by using the charge/discharge current and the internal resistance, and calculates the electromotive force by subtracting the polarization voltage from the battery terminal voltage.

11. A method for estimating a battery SOC using a battery management system, comprising:
    calculating a unit SOC by using a charge/discharge current of a battery;
    calculating an electromotive force SOC by using an electromotive force of the battery;
    calculating a compensation amount by using the electromotive force SOC and the previous SOC; and
    calculating a current SOC by adding the unit SOC, the previous SOC, and the compensation amount, wherein the calculation of the current SOC is performed based on:

$$SOCn+1=SOCn+SOCi+Kp(SOCv-SOCn)+Ki\int(SOCv-SOCn)dt$$

where SOCn+1 is the current SOC, SOCn is the previous SOC, SOCi is the unit SOC, SOCv is the electromotive force SOC, and Kp and Ki are constants.

12. A method for estimating a battery SOC using a battery management system, comprising:
    calculating a unit SOC by using a charge/discharge current of a battery;
    calculating an electromotive force SOC by using an electromotive force of the battery;
    calculating an integration SOC by adding the unit SOC and the previous SOC;
    calculating a compensation amount by using the integration SOC, the electromotive force SOC, and the previous SOC; and
    calculating a current SOC by adding the integration SOC and the compensation amount, wherein calculating the current SOC is performed based on:

$$SOCn+1=SOCI+SOCi+Kp(SOCv-SOCI)+Ki\int(SOCv-SOCI)dt$$

where SOCn+1 is the current SOC, SOCI is the integration SOC, SOCv is the electromotive force SOC, and Kp and Ki are constants.

13. The method as claimed in claim 12, wherein calculating the unit SOC includes:
    integrating the charge/discharge current during a unit time to calculate a unit time charge/discharge charge amount; and dividing the unit time charge/discharge charge amount by the total charge/discharge charge amount of the battery.

14. The method as claimed in claim 13, further comprising correcting the compensation amount according to the unit time charge/discharge charge amount.

15. The method as claimed in claim 14, wherein correcting the compensation amount is executed for the current SOC to be included in a predetermined SOC range with reference to the previous SOC when the unit time charge/discharge charge amount is smaller than a predetermined threshold unit charge/discharge charge amount.

16. The method as claimed in claim 14, wherein correcting the compensation amount is executed for the current SOC to be increased or decreased corresponding to the charge/discharge of the battery, respectively.

* * * * *